(12) United States Patent
Zhang

(10) Patent No.: US 10,715,925 B2
(45) Date of Patent: Jul. 14, 2020

(54) MEMS MICROPHONE

(71) Applicant: AAC Acoustic Technologies (Shenzhen) Co., Ltd., Shenzhen (CN)

(72) Inventor: Jinyu Zhang, Shenzhen (CN)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 0 days.

(21) Appl. No.: 16/057,909

(22) Filed: Aug. 8, 2018

(65) Prior Publication Data

US 2019/0166433 A1 May 30, 2019

(30) Foreign Application Priority Data

Nov. 28, 2017 (CN) .................... 2017 2 1613935 U

(51) Int. Cl.
- *H04R 19/04* (2006.01)
- *H04R 19/00* (2006.01)
- *B81B 3/00* (2006.01)

(52) U.S. Cl.
CPC ........... *H04R 19/04* (2013.01); *B81B 3/0021* (2013.01); *H04R 19/005* (2013.01);
(Continued)

(58) Field of Classification Search
CPC ...... H04R 19/04; H04R 19/005; H04R 19/01; H04R 19/016; H04R 2201/003; H04R 2201/02; H04R 2201/029; B81B 3/0021; B81B 2201/0257; B81B 2203/0136; B81B 2203/0315; B81B 2203/0223; B81B 2203/033; B81B 2203/0338; B81B 2203/0346; B81B 2203/0353; B81B 2203/0361; B81B 2203/04; B81B 5/00; B81B 3/00; B81B 2207/07; B81B 2201/033; B81C 1/00015; B81C 1/00166; B81C 1/00095; B81C 1/0015; H01H 1/0036; H01H 59/0009; H03H 9/02244; H02N 1/008

See application file for complete search history.

(56) References Cited

U.S. PATENT DOCUMENTS

| | | | |
|---|---|---|---|
| 6,769,616 B2 * | 8/2004 | Fu ........................ | G02B 6/359 235/454 |
| 9,402,137 B2 * | 7/2016 | Hsu ...................... | H04R 19/005 |

(Continued)

*Primary Examiner* — Fan S Tsang
*Assistant Examiner* — Angelica M McKinney
(74) *Attorney, Agent, or Firm* — IPro, PLLC; Na Xu

(57) ABSTRACT

An MENS microphone is provided in the present disclosure. The MENS microphone includes a fixing pole plate, a vibrating pole plate, an elastic arm; the fixing pole plate comprises a first fixing electrode, an insulating layer, a second fixing electrode that are superimposed sequentially, a through hole penetrating through the first fixing pole plate, the insulating layer and the second fixing pole plate; the vibrating pole plate is embedded in the through hole, comprises a main body and a plurality of spaced protrusions provided on two opposite side walls of the main body; the fixing pole plate comprises a plurality of spaced grooves recessed from two opposite inner walls of the fixing pole plate respectively toward corresponding outer walls, the grooves penetrates through the first fixing electrode, the insulating layer, the second fixing electrode; the protrusions are inserted into the grooves and correspond to the grooves one to one.

7 Claims, 3 Drawing Sheets

(52) U.S. Cl.
CPC .............. *B81B 2201/0257* (2013.01); *B81B 2203/0136* (2013.01); *B81B 2203/04* (2013.01); *B81B 2203/053* (2013.01); *H04R 2201/003* (2013.01)

(56) References Cited

U.S. PATENT DOCUMENTS

| | | | | |
|---|---|---|---|---|
| 9,611,135 | B1* | 4/2017 | Klein | H02N 2/02 |
| 2003/0082917 | A1* | 5/2003 | Hopkins, Jr. | B81C 1/0015 |
| | | | | 438/694 |
| 2006/0201249 | A1* | 9/2006 | Horning | H02N 1/008 |
| | | | | 73/504.14 |
| 2006/0284514 | A1* | 12/2006 | Ko | G02B 26/0841 |
| | | | | 310/309 |
| 2010/0124343 | A1* | 5/2010 | Zhang | H04R 19/005 |
| | | | | 381/174 |
| 2013/0181302 | A1* | 7/2013 | Giroud | B81C 1/00015 |
| | | | | 257/415 |
| 2019/0116429 | A1* | 4/2019 | Meisel | H04R 19/04 |

* cited by examiner

MEMS MICROPHONE

FIELD OF THE DISCLOSURE

The present disclosure relates to the technical field of electro-acoustic conversion, and more particular to an MENS microphone.

BACKGROUND

In recent years, mobile communication technology has witnessed its rapid development and more and more consumers use mobile communication devices, for example, a mobile phone, a handheld game machine, a navigation device or a handheld multimedia entertainment device or the like.

Micro-Electro-Mechanical System (MEMS) microphone is an electro-acoustic transducer manufactured with micromachining technology and features small volume, good frequency response characteristics and low noise and the like. Along with electronic devices developing to be smaller, lighter and thinner, MEMS microphones are more widely applied to these devices.

In related art, a MEMS microphone may include a vibrating pole plate and a fixing pole plate provided oppositely with a spacing from the vibrating pole plate. A capacitance is formed between the vibrating pole plate and the fixing pole plate. When an external sound wave causes the vibrating pole plate to vibrate and generate a shift, the capacitance between the vibrating pole plate and the fixing pole plate may be changed and converted into an electric signal corresponding to an on-demand signal. Thus, the function of electro-acoustic conversion is completed.

Because electronic components in an electronic device, to which an MEMS microphone is applied, increase rapidly in quantity and kind, electro-magnetic environment where the MEMS microphone is located becomes more complex and changeable, so that a chip of the microphone is subjected to electro-magnetic interference more visibly, thereby seriously affecting performance of the MEMS microphone.

Therefore, it is desired to provide an MENS microphone to overcome the aforesaid problems.

BRIEF DESCRIPTION OF THE DRAWINGS

Many aspects of the embodiments can be better understood with reference to the following drawings. The components in the drawing are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

The present disclosure will be described in detail below with reference to the attached drawings and embodiments thereof.

Figure 1:
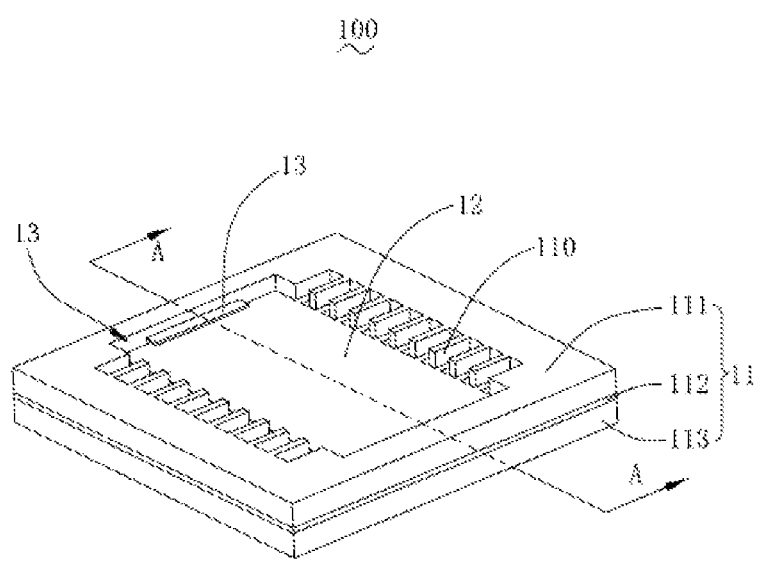
FIG. 1 stereoscopic diagram illustrating an MEMS microphone according to an example of the present invention.
Figure 2:
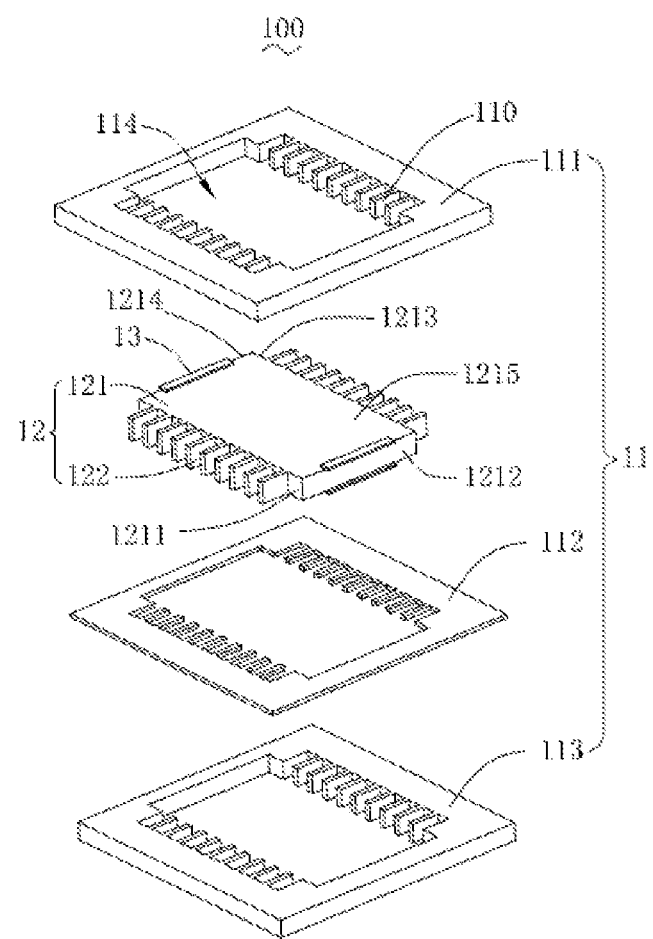
FIG. 2 is an exploded diagram illustrating the MEMS microphone shown in FIG. 1.
Figure 3:
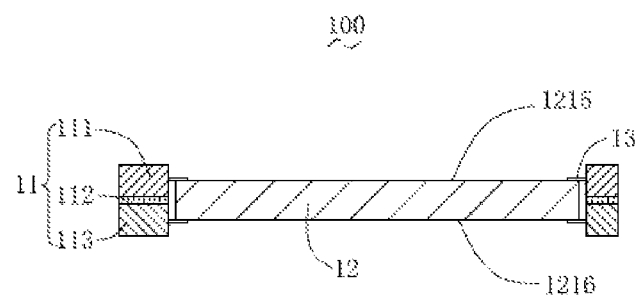
FIG. 3 is a sectional diagram of the MEMS microphone shown in FIG. 1 along an A-A line.

A reference may be made to FIG. 1, FIG. 2 and FIG. 3, where FIG. 1 is a stereoscopic diagram illustrating an MEMS microphone according to an example of the present invention; FIG. 2 is an exploded diagram illustrating the MEMS microphone shown in FIG. 1 and FIG. 3 is a sectional diagram of the MEMS microphone shown in FIG. 1 along an A-A line. The MEMS microphone 100 includes a fixing pole plate 11, a vibrating pole plate 12 provided on the fixing pole plate and an elastic arm 13 connecting the fixing pole plate 11 and the vibrating pole plate 12.

The fixing pole plate 11 is of quadrilateral shape including a first fixing electrode 111, an insulating layer 112 and a second fixing electrode 113 that are superimposed sequentially. A through hole 114 is formed in a thickness direction of the fixing pole plate 11 so that the fixing pole plate 11 forms into a ring type structure.

A plurality of spaced grooves 110 are formed on two opposite inner walls of the fixing pole plate 11. Specifically, the grooves 110 are formed by recessing from the two opposite inner walls of the fixing pole plate 11 respectively toward corresponding outer walls. Also, the grooves 110 formed on the two opposite inner walls of the fixing pole plate 11 are symmetrically distributed. Each of the grooves 110 penetrates the first fixing electrode 111, the insulating layer 112 and the second fixing electrode 113.

Preferably, the first fixing electrode 111 and the second fixing electrode 113 are equal in thickness, so that generation of electric signals with same sizes and opposite phases on the first fixing electrode 111 and the second fixing electrode 113 may be facilitated during a vertical vibration of the vibrating pole plate 12, bringing better anti-interference performance.

The vibrating pole plate 12 is smaller than the fixing pole plate 11 in thickness and may vibrate vertically within a range of the through hole 114. The vibrating pole plate 12 includes a main body 121, a plurality of spaced protrusions 122 provided on two opposite side walls of the main body 121. The protrusions 122 are inserted into the grooves 110 and the number of the protrusions 122 is same as that of the grooves 100. The protrusions 122 correspond to the grooves 110 one to one. That is, the two opposite inner walls of the fixing pole plate 11 and the two opposite side walls of the vibrating pole plate 12 are formed into comb-tooth-shaped structures that are adapted to each other.

Specifically, the main body 121 includes a first side wall 1211, a second side wall 1212, a third side wall 1213 and a fourth side wall 1214 whose heads and tails are connected sequentially and a first surface 1215 and a second surface 1216 connected with two opposite end surfaces of the first side wall 1211, the second side wall 1212, the third side wall 1213 and the fourth side wall 1214. The protrusions 122 are formed on the first side wall 1211 and the third side wall 1213, and the second side wall 1212 and the fourth side wall 1214 are provided with a spacing from inner walls of the fixing pole plate 11.

The elastic arm 13 is configured to connect the fixing pole plate 11 and the vibrating pole plate 12 so that the vibrating pole plate 12 may not fall down during vertical vibration. The elastic arm 13 is of strip shape, one end of which is connected with the vibrating pole plate 12 and the other end is connected with the fixing pole plate 11.

Specifically, one end of the elastic arm 13 is connected with the first surface 1215 and/or the second surface 1216 and the other end is connected with an inner wall that is on the fixing pole plate 11 and corresponds to the second side wall 1212 and/or the fourth side wall 1214.

In an example, there may be four elastic arms 13 uniformly distributed on the first surface 1215 and the second surface 1216, where two of the elastic arms 13 are connected to an inner wall that is on the fixing pole plate 11 and corresponds to the second surface 1212 and the other two of the elastic arms 13 are connected to an inner wall that is on the fixing pole plate 11 and corresponds to the fourth side wall 1214.

When a sound pressure is loaded to a surface of the vibrating pole plate 12, the vibrating pole plate 12 may vibrate vertically. During the vibration, an opposite area between the first fixing electrode 111 and the vibrating pole plate 12 and an opposite area between the second fixing electrode 113 and the vibrating pole plate 12 may take opposite changes in real time so that electric signals with same size and opposite phases are generated on the first fixing electrode and the second fixing electrode, thereby implementing differential output. When electro-magnetic interference is present in an environment, two electrodes may sense electric signals with same phases. When signals are processed, interferential signals are offset mutually, thereby realizing stronger interference immunity.

Compared with related art, benefits of MEMS microphone provided by the present invention are as follows:

I. The MEMS microphone provided in the present invention is changed into a differential microphone by changing a connecting relationship of the vibrating pole plate and the fixing pole plate. When an electro-magnetic interference is present in an environment, two electrodes may sense electric signals with same phases. When signals are processed, interferential signals are offset mutually, thereby realizing stronger interference immunity.

II. The fixing pole plate does not have a suspended part so that the MEMS microphone has higher strength.

III. The MEMS microphone is stronger than a traditional differential microphone in resistance against particles and water immersion.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. A MEMS microphone, comprises:
   a fixing pole plate which comprises:
      a first fixing electrode;
      an insulating layer;
      a second fixing electrode that are superimposed sequentially; and
      a through hole penetrating through the first fixing electrode, the insulating layer and the second fixing electrode;
   a vibrating pole plate vibrating vertically and provided on the fixing pole plate, which comprises:
      a main body; and
      a plurality of spaced protrusions provided on two opposite side walls of the main body; and
   an elastic arm connecting the fixing pole plate and the vibrating pole plate;
   wherein the fixing pole plate further comprises a plurality of spaced grooves recessed from two opposite inner walls of the fixing pole plate respectively toward corresponding outer walls, and each of the grooves penetrates through the first fixing electrode, the insulating layer and the second fixing electrode; the protrusions are inserted into the grooves and correspond to the grooves one to one;
   the first fixing electrode is equal to the second fixing electrode in thickness.

2. The MEMS microphone as described in claim 1, wherein the vibrating pole plate is smaller than the fixing pole plate in thickness.

3. The MEMS microphone as described in claim 2, wherein the elastic arm is of strip shape.

4. The MEMS microphone as described in claim 1, wherein the main body comprises a first side wall, a second side wall, a third side wall and a fourth side wall whose heads and tails are connected sequentially and a first surface and a second surface connected to two opposite end surfaces of the first side wall, the second side wall, the third side wall and the fourth side wall; the protrusions are provided on the first side wall and the third side wall; one end of the elastic arm is connected with the first surface and/or the second surface and the other end is connected with an inner wall that is on the fixing pole plate and corresponds to the second side wall and/or the fourth side wall.

5. The MEMS microphone as described in claim 4, wherein there are four elastic arms uniformly distributed on the first surface and the second surface; two of the elastic arms are connected with an inner wall that is on the fixing pole plate and corresponds to the second side wall and the other two are connected with an inner wall that is on the fixing pole plate and corresponds to the fourth side wall.

6. The MEMS microphone as described in claim 4, wherein the elastic arm is of strip shape.

7. The MEMS microphone as described in claim 1, wherein the elastic arm is of strip shape.

* * * * *